United States Patent
Xu et al.

(10) Patent No.: US 11,404,371 B2
(45) Date of Patent: Aug. 2, 2022

(54) ONE-TIME PROGRAMMABLE CAPACITIVE FUSE BIT AND A MEMORY

(71) Applicant: NO.24 RESEARCH INSTITUTE OF CHINA ELECTRONICS TECHNOLOGY GROUP CORPORATION, Chongqing (CN)

(72) Inventors: Mingyuan Xu, Chongqing (CN); Shuiqin Yao, Chongqing (CN); Liang Li, Chongqing (CN); Xiaofeng Shen, Chongqing (CN); Hongrui Yang, Chongqing (CN); Jian'an Wang, Chongqing (CN); Dongbing Fu, Chongqing (CN); Guangbing Chen, Chongqing (CN); Xingfa Huang, Chongqing (CN); Xi Chen, Chongqing (CN)

(73) Assignee: NO.24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 98 days.

(21) Appl. No.: 16/620,875

(22) PCT Filed: Jul. 18, 2018

(86) PCT No.: PCT/CN2018/096089
§ 371 (c)(1),
(2) Date: Apr. 22, 2020

(87) PCT Pub. No.: WO2019/210583
PCT Pub. Date: Nov. 7, 2019

(65) Prior Publication Data
US 2021/0280513 A1    Sep. 9, 2021

(30) Foreign Application Priority Data

May 4, 2018 (CN) .......................... 201810420182.6

(51) Int. Cl.
*H01L 23/525* (2006.01)
*G11C 17/16* (2006.01)
*G11C 17/18* (2006.01)

(52) U.S. Cl.
CPC .......... *H01L 23/5256* (2013.01); *G11C 17/16* (2013.01); *G11C 17/18* (2013.01)

(58) Field of Classification Search
CPC ............. H01L 23/5256; H01L 23/5252; H01L 23/5223; H01L 23/528; H01L 23/5283;
(Continued)

(56) References Cited

U.S. PATENT DOCUMENTS 5,536,968 A    7/1996 Crafts et al.
7,715,247 B2   5/2010 Kim
(Continued)

FOREIGN PATENT DOCUMENTS

| CN | 102339949 A | * | 2/2012 | |
| CN | 107437546 A | * | 12/2017 | ............. G11C 17/16 |
| KR | 20100120877 A | * | 11/2010 | ......... H01L 23/5256 |

*Primary Examiner* — John P. Dulka

(57) ABSTRACT

The present disclosure provides a one-time programmable capacitive fuse bit, including an upper plate, the upper plate includes a plurality of fuses arranged side by side and spaced by an internal from each other, middle portions of two adjacent fuses are connected to each other; a connecting portion connected to the fuse is disposed above two ends and the middle portion of each of the plurality of fuses; the fuse bit further includes a lower plate corresponding to the two ends and the middle portion of the fuse, the lower plate is disposed below the fuse; the lower plate corresponding to the middle portion of the fuse is opposite to the connecting portion corresponding to the middle portion of the fuse; a hollow portion is disposed between the lower plate corresponding to the middle portion of the fuse and the lower plate corresponding to both ends of the fuse.

10 Claims, 2 Drawing Sheets

(58) Field of Classification Search
CPC ........... H01L 23/5226; H01L 21/76805; G11C 17/16; G11C 17/18; G11C 17/165; G11C 17/143
See application file for complete search history.

(56) References Cited

U.S. PATENT DOCUMENTS

| | | |
|---|---|---|
| 7,968,967 B2 | 6/2011 | Wang et al. |
| 9,842,802 B2 * | 12/2017 | Wang ................. H01L 27/11206 |
| 2008/0079113 A1 * | 4/2008 | Chinthakindi ...... H01L 23/5256 |
| | | 257/E23.149 |
| 2010/0252908 A1 * | 10/2010 | Schlarmann ........ H01L 23/5256 |
| | | 257/E23.149 |
| 2015/0311216 A1 | 10/2015 | Hidaka et al. |
| 2017/0345827 A1 * | 11/2017 | Chang ............. H01L 21/823475 |

* cited by examiner

ONE-TIME PROGRAMMABLE CAPACITIVE FUSE BIT AND A MEMORY

CROSS REFERENCE TO RELATED APPLICATION

This is a Sect. 371 National Stage of PCT International Application No. PCT/CN2018/096089, filed on 18 Jul. 2018, which claims priority of a Chinese Patent Application No. 2018104201826 filed on 4 May 2018, the contents of both applications hereby being incorporated by reference in their entirety for all purposes.

BACKGROUND

Field of Disclosure

The present disclosure relates to a fuse, in particular, to a one-time programmable capacitive fuse bit and a memory.

Description of Related Arts

For one-time programmed fuse unit, the stored data can be retained even if the power is lost. This feature is called non-volatile. Under the current advanced technology, the costs for taping-out and debugging of the chip increase. Therefore, non-volatile memory cells are designed to store the information after debugging. Firstly, in order to compensate for the circuit performance deviation caused by process fluctuations, it is necessary to perform single-chip data configuration to the finished integrated circuit, to achieve the best performance. Secondly, the fuse unit solves the problem of storing the data well by configuring the working mode, operating state, and the like.

Conventional fuse units mainly use large current to cause polysilicon or metal leads to blow, and the stored solidification information is obtained by reading whether it is open or shorted. The conventional fuse unit occupies a large chip area, and the metal lead has a large blowing current. Since the resistance of the read resistor is used, a pull down or pull up MOS resistor bias circuit is designed to increase the system power consumption. In advanced processes, such as the 0.18 um process, an anti-fuse design occurs. The anti-fuse design stores information by breaking down a gate oxide of the MOS device into a resistor. The advantage is that more data can be stored in the same area than the conventional fuse. The disadvantage is that the circuit design is complicated, which includes the reference circuit, the level conversion circuit, the charge pump circuit, etc., and still consumes the area of the system chip design layout.

The conventional fuse design using polysilicon occupies a large design area and is read by a resistor, a level shifting circuit or a high withstand voltage device is designed. Since high voltage is applied to both ends of the fuse when writing data, large current passes through the fuse unit, resistance of the fuse unit is high power heated, the fuse unit blows (i.e., melt). The linked circuit should be protected when high voltage is applied, to avoid burning the circuits such as the reading circuit. Polysilicon is thinner than metal leads, and the blowing current is smaller than that of the fuse of the metal lead. The thickness of the fuse of the metal lead is determined by the tape-out process. In order to reduce the resistance of the metal wire, the fuse of the metal lead is generally designed to be thick, the blowing current is large. The large blowing current can only be achieved by applying a higher voltage externally, and therefore a high voltage protection design is required.

Compared with the traditional fuse, the anti-fuse has the advantage of small area and large data capacity. The anti-fuse also obtains the storage information by reading the resistance characteristics. The design of anti-fuse requires the support of multiple power supplies, the level conversion circuit, the reference circuit, the charge pump circuit, and the like. The circuit system is complicated.

SUMMARY OF THE PRESENT DISCLOSURE

The present disclosure provides a one-time programmable capacitive fuse and a memory.

The present disclosure provides a one-time programmable capacitive fuse bit, including an upper plate 3, the upper plate includes a plurality of fuses 5 arranged side by side and spaced apart from each other, middle portions of two adjacent fuses are connected to each other; a connecting portion connected to the fuse is disposed above two ends and the middle portion of each of the plurality of fuses; the fuse bit further includes a lower plate 2 corresponding to the two ends and the middle portion of the fuse, the lower plate is disposed below the fuse; the lower polar corresponding to the middle portion of the fuse is opposite to the connecting portion corresponding to the middle portion of the fuse; a hollow portion 4 is disposed between the lower plate corresponding to the middle portion of the fuse and the lower polar plate corresponding to both ends of the fuse, and a projection of an edge of both ends of the fuse is located in the hollow portion.

Preferably, the plurality of fuses includes a rectangular plate structure. Preferably, adjacent fuses are arranged in parallel.

Preferably, adjacent fuses are spaced by a same internal from each other. Preferably, the connecting portion includes a metal wire.

Preferably, the upper plate includes a metal upper plate of a MIM capacitor. Preferably, the lower plate includes a metal lower plate of a MIM capacitor.

The present disclosure further provides a memory, including the one-time programmable capacitive fuse bit.

Preferably, the memory further includes a word line WL connected with the lower polar plate and a bit line BL connected with the fuse, one fuse corresponds to one bit line BL, eight bit lines BL are connected with one word line WL, a write voltage WV is connected with the upper plate, and all write voltages WV are connected together.

As described above, the one-time programmable capacitive fuse and memory of the present disclosure has the following beneficial effects:

1. The fuse structure of the present disclosure is on the top layer of the process layers and does not occupy the underlying layout area.

2. The fuse structure of the present disclosure adopts the upper plate of MIM, which is thinner than the metal wiring layer, and the blowing current is not larger than that of the metal wiring fuse.

3. The read circuit of the fuse structure of the present disclosure is connected with the lower plate of the MIM capacitor, physically isolating the blown high voltage, and for the read circuit design, the high voltage protection is not considered.

4. The present disclosure does not require a special layout layer, and instead it only requires that an MIM capacitor is provided in the manufacturing process.

DETAILED DESCRIPTION OF THE PREFERRED EMBODIMENTS

The embodiments of the present disclosure will be described below. Those skilled in the art can easily understand other advantages and effects of the present disclosure according to contents disclosed by the specification. The present disclosure can also be implemented or applied through other different specific embodiments. Various modifications or changes can also be made to all details in the specification based on different points of view and applications without departing from the spirit of the present disclosure. It needs to be stated that the following embodiments and the features in the embodiments can be combined with one another if no conflict will result from such combination.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complex.

Figure 1:
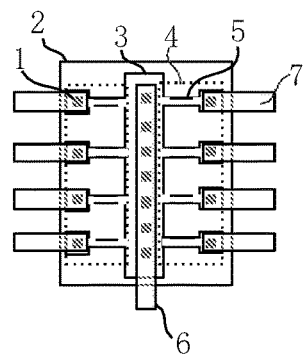
FIG. 1 is a top view of a one-time programmable capacitive fuse.
Figure 2:
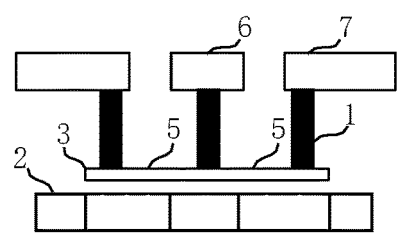
FIG. 2 is a cross-sectional view of the one-time programmable capacitive fuse.

This embodiment provides a one-time programmable capacitive fuse bit, as shown in FIGS. 1-2. The fuse bit includes an upper plate 3, and the upper plate 3 is a metal upper plate of a MIM capacitor. The upper plate 3 includes a plurality of fuses 5 arranged side by side and spaced by an internal from each other, and middle portions of adjacent fuses are connected to each other. The fuse each has a rectangular plate structure. Adjacent fuses are arranged in parallel, and spacings between adjacent fuses are equal.

A connecting portion connected to the fuse is respectively disposed at an upper space of two ends and the middle portion of each of the plurality of fuses. Specifically, the fuse and the connecting portion are connected by a through hole 1, the connecting portion is a metal wire. The metal wire 6 is connected with the middle portion of the fuse, and the metal wire 7 is connected with both ends of the fuse. In this embodiment, the thickness of the fuse is thinner than the thickness of the metal wire.

The fuse bit further includes a lower plate 2 corresponding to both ends and the middle portion of the fuse. The lower plate is a metal lower plate of a MIM capacitor. The lower plate is disposed below the fuse. The lower plate corresponding to the middle portion of the fuse is opposite to the connecting portion corresponding to the middle portion of the fuse. A hollow portion 4 is disposed between the lower plate corresponding to the middle portion of the fuse and the lower plate corresponding to both ends of the fuse. Projections of edges of two ends of the fuse are located in the hollow portion.

In the present disclosure, the fuse 5 is blown by a voltage difference between the metal wire 6 and the metal wire 7. The state of the fuse 5 can be determined by reading the change in the capacitance value between the lower plate and the metal wire 7. The capacitance value refers to the capacitance between the middle portion of the fuse 5 and the lower plate corresponding to the middle portion of the fuse.

Figure 5:
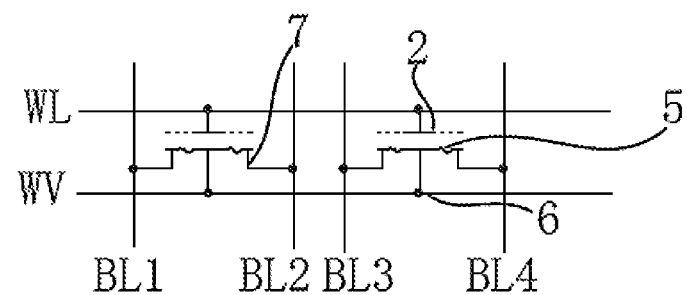
FIG. 5 is an electrical principle diagram of a memory.
Figure 6:
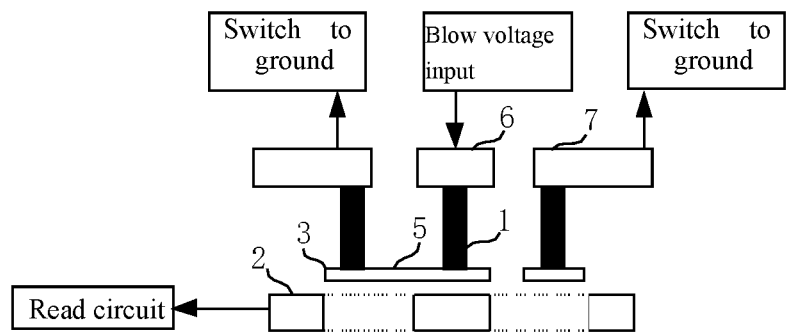
FIG. 6 is a block diagram of the application of the memory.

As shown in FIGS. 5-6, the present embodiment further provides a memory, including a word line and a bit line. The word line WL is connected with the lower plate 2, the bit line BL is connected with the upper plate, and the write voltage WV is connected with the upper plate. One fuse 5 corresponds to one bit line BL, eight bit lines BL are connected with one word line WL, and all write voltages WV are connected together.

Figure 3:
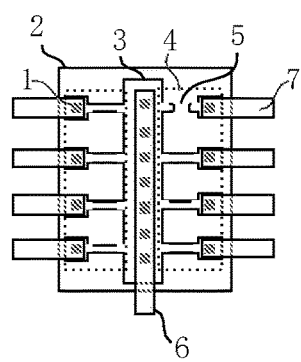
FIG. 3 is a top view of the one-time programmable capacitive fuse structure after being blown.
Figure 4:
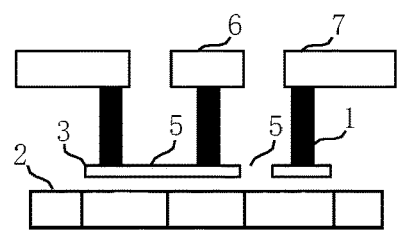
FIG. 4 is a cross-sectional view of the one-time programmable capacitive fuse structure after being blown.

The working principle is as follows:

When writing data, a voltage Vw is applied to the write voltage port WV, and a bit line BL is selected to be grounded. At this time, a voltage difference is formed between the metal wire 6 and the metal wire 7. The voltage difference is applied to the fuse 5. The resistance of the fuse 5 generates the heat power P=U2/R, the fuse 5 is blown. The fuse after being blown is shown in FIGS. 3-4.

When reading data, the read circuit is connected with the lower plate, and the gate bit line BL is connected to the ground. The change in the capacitance value between the lower polar plate and the gate bit line is read to determine the state of the fuse 5. The capacitance value is calculated as:

$$C = \frac{\varepsilon_r S}{4\pi k d}$$

$\varepsilon_r$ represents a dielectric constant, k represents an electrostatic force constant, S represents the opposite area of two plates, and d represents the distance between the two plates.

In the case of not being blown, the metal wire 7 connects the fuse 5 with the upper plate of the MIM forming the capacitor via the through hole. The metal wire 7 and the lower plate 2 are connected by the capacitor MIM.

In the case of being blown, no capacitor is disposed below the metal wire 7, the fuse is blown and disconnected with the formed MIM capacitor. No MIM capacitor is connected between the metal wire 7 and the lower plate 2.

The change in capacitance value between the metal wire 7 and the lower plate 2 is read. It is not necessary to read the exact capacitance value to determine the state of the fuse. As shown in FIG. 3, the read circuit physically isolates the influence of the blown voltage, and it is not necessary to design a high voltage protection for the read circuit.

When adopting the standard 0.18 μm CMOS process, the fuse structure is designed to have a size of 6 square value, the fuse voltage VW is 5V. When adopting the standard 65 nm CMOS process, the fuse structure is designed to have a size of 6 square value, and the fuse voltage VW is 4V.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

We claim:

1. A one-time programmable capacitive fuse bit, comprising an upper plate (3), wherein the upper plate comprises a plurality of fuses (5) arranged side by side and spaced apart from each other, each fuse of the plurality of fuses (5) comprises two ends and a middle portion, and middle portions of each two adjacent fuses of the plurality of fuses (5) are connected to each other;
   a first connecting portion connected to the plurality of fuses (5) is disposed above the ends of the plurality of fuses (5), and a second connecting portion connected to the plurality of fuses (5) is disposed above the middle portions of the plurality of fuses (5);
   the fuse bit further comprises a plurality of lower plates (2), wherein the plurality of lower plates (2) comprises a first lower plate corresponding to the ends of the plurality of fuses (5), and a second lower plate corresponding to the middle portions of the plurality of fuses (5), and the plurality of lower plates is disposed below the plurality of fuses (5);
   the second lower plate is opposite to the second connecting portion;
   a hollow portion (4) is disposed between the first lower plate and the second lower plate, and a projection of an edge of both ends of the plurality of fuses (5) is located in the hollow portion.

2. The one-time programmable capacitive fuse bit according to claim 1, wherein each fuse of the plurality of fuses includes a rectangular plate structure.

3. The one-time programmable capacitive fuse bit according to claim 2, wherein each two adjacent fuses of the plurality of fuses (5) are arranged in parallel.

4. The one-time programmable capacitive fuse bit according to claim 3, wherein each two adjacent fuses of the plurality of fuses (5) are spaced apart by the same interval from each other.

5. The one-time programmable capacitive fuse bit according to claim 1, wherein the first connecting portion includes a metal wire.

6. The one-time programmable capacitive fuse bit according to claim 1, wherein the upper plate includes a metal upper plate of a MIM capacitor.

7. The one-time programmable capacitive fuse bit according to claim 6, wherein the lower plate includes a metal lower plate of a MIM capacitor.

8. The one-time programmable capacitive fuse bit according to claim 1, wherein the plurality of lower plates includes a metal lower plate of a MIM capacitor.

9. A memory, comprising a one-time programmable capacitive fuse bit, wherein the one-time programmable capacitive fuse bit comprises an upper plate (3), wherein the upper plate comprises a plurality of fuses (5) arranged side by side and spaced apart from each other, each fuse of the plurality of fuses (5) comprises two ends and a middle portion, and middle portions of each two adjacent fuses of the plurality of fuses (5) are connected to each other;
   a first connecting portion connected to the plurality of fuses (5) is disposed above the ends of the plurality of fuses (5), and a second connecting portion connected to the plurality of fuses (5) is disposed above the middle portions of the plurality of fuses (5);
   the fuse bit further comprises a plurality of lower plates (2), wherein the plurality of lower plates (2) comprises a first lower plate corresponding to the ends of the plurality of fuses (5), and a second lower plate corresponding to the middle portions of the plurality of fuses (5), and the plurality of lower plates is disposed below the plurality of fuses (5);
   the second lower plate is opposite to the second connecting portion;
   a hollow portion (4) is disposed between the first lower plate and the second lower plate, and a projection of an edge of both ends of the plurality of fuses (5) is located in the hollow portion.

10. The memory according to claim 9, further comprising a plurality of word lines connected with the lower plates, and a plurality of bit lines connected with the plurality of fuses, wherein
   one fuse of the plurality of fuses corresponds to one bit line of the plurality of bit lines,
   eight bit lines of the plurality of bit lines are connected with one word line of the plurality of word lines, and
   write voltages are connected together and connected with the upper plate.

* * * * *